United States Patent [19]
Sorko-Ram

[11] Patent Number: 5,183,688
[45] Date of Patent: Feb. 2, 1993

[54] CONVEX REFLECTIVE SIGN AND METHOD OF MAKING SAME

[76] Inventor: Paul Sorko-Ram, 1111 N. Centerville Rd., Sturgis, Mich. 49091

[21] Appl. No.: 638,701

[22] Filed: Jan. 8, 1991

Related U.S. Application Data

[63] Continuation-in-part of Ser. No. 428,637, Oct. 30, 1989, abandoned.

[51] Int. Cl.⁵ ............................................. B05D 5/06
[52] U.S. Cl. .................................. 427/164; 427/250; 427/282; 427/287
[58] Field of Search ............... 427/164, 282, 250, 287, 427/162

[56] References Cited

U.S. PATENT DOCUMENTS

| | | | |
|---|---|---|---|
| 4,102,734 | 7/1978 | Schiffman | 427/282 |
| 4,253,910 | 3/1981 | Mason | 427/282 |
| 4,267,000 | 5/1981 | Dix et al. | 427/282 |

Primary Examiner—Janyce Bell
Attorney, Agent, or Firm—Krass & Young

[57] ABSTRACT

The invention is a convex mirror for surveillance purposes, in combination with an advertising message, and the method of fabricating same. A removable mask is attached to the interior of the surface to be mirrored, and a non-reactive removable liquid mask is applied to the openings in the removable mask. The removable mask is removed, and a mirror material is applied to the surface. The liquid mask is allowed to solidify, then removed, leaving one or more transparent areas in the surface of the mirror.

5 Claims, 4 Drawing Sheets

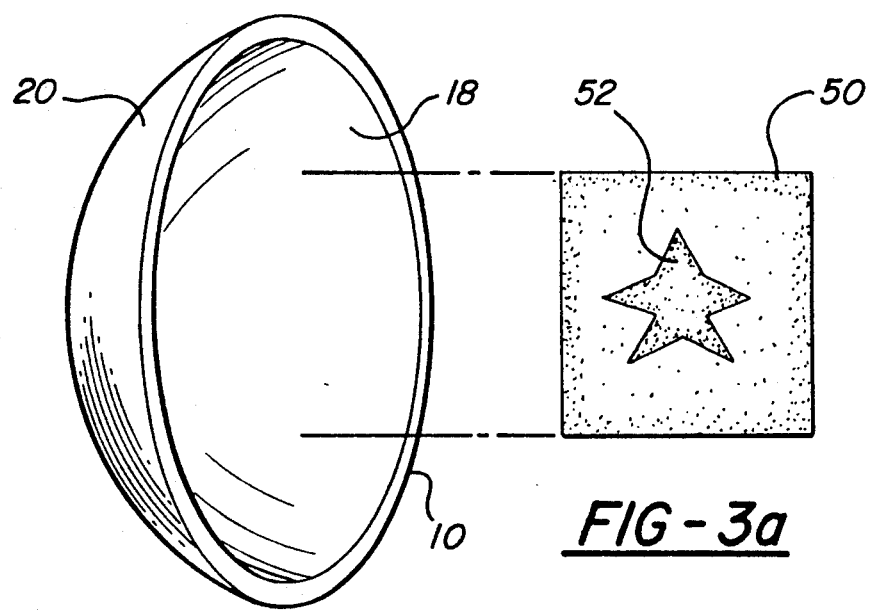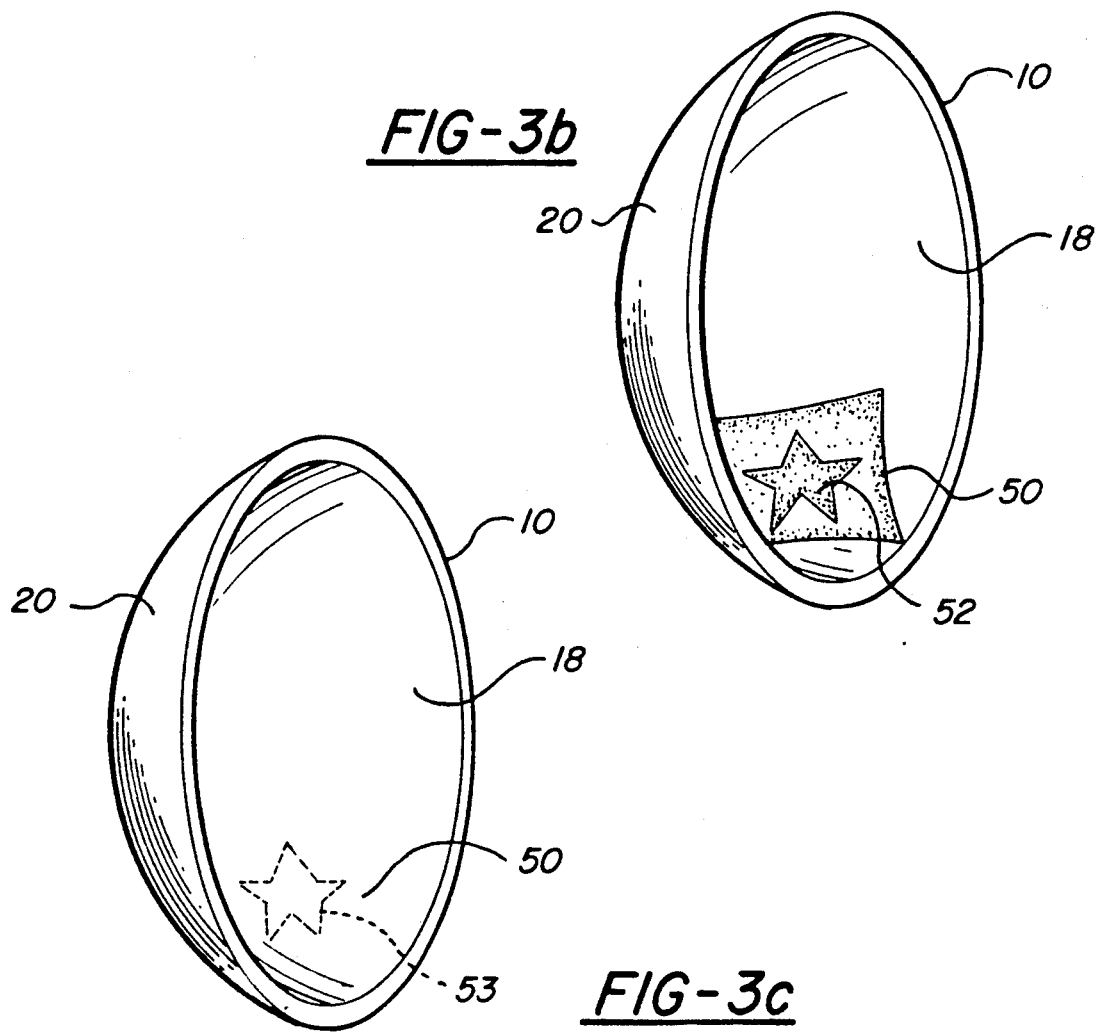

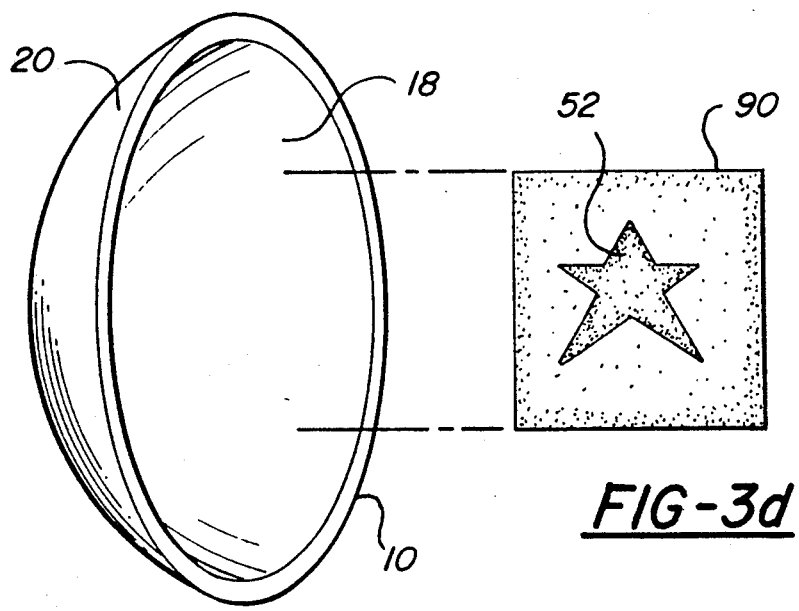
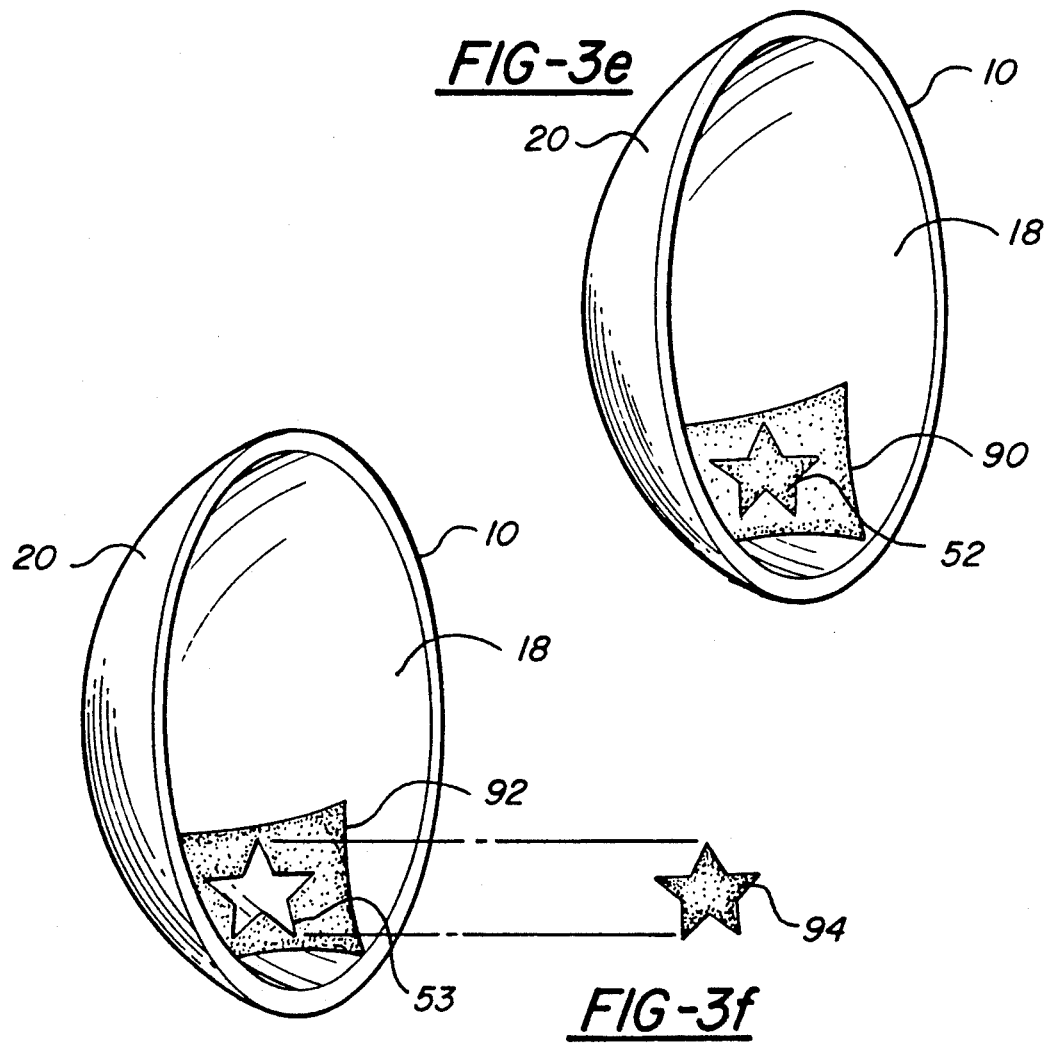

CONVEX REFLECTIVE SIGN AND METHOD OF MAKING SAME

RELATED APPLICATION

This application is a continuation in part of Ser. No. 428,637, filed Oct. 30, 1989, for Convex Reflective Sign now abandoned.

FIELD OF THE INVENTION

The invention pertains to signs, and more particularly, signs having convex mirrors as a background on which to display advertising material.

BACKGROUND OF THE INVENTION

Convex mirrors are well-known as devices which are useful for providing a viewer with an expanded field of view by virtue of the reflections which are visible in the mirror. By virtue of their optical properties, convex mirrors provide a substantially wider, albeit distorted, field of view than that which is available from a conventional flat mirror. Further, by virtue of their usefulness as security and anti-theft devices, convex mirrors have become commonplace fixtures in commercial establishments, for example, retail stores. Such a device is shown by Ross in U.S. Pat. No. 3,316,052.

Mirrors have long been used as attractive backgrounds for signs. It has long been known to superimpose an advertising message on a mirrored background as a method of attracting a viewer's attention to the message. However, these signs have typically been used as decorative and advertising devices only, inasmuch as the conventional mirror provides limited enhancement to the product point of sale, for example, on the wall of a tavern or similar establishment, for the purpose of directing a purchaser's attention to a particular product brand name. See, for example, U.S. Pat. No. 1,849,708, issued to Colbert, et al.

The application of a desired advertising message, pattern, or art on a convex acrylic mirror presents significant production problems. The mirrored surface of such devices is the result of deposition of vaporized metals on one surface of a two-sided acrylic material. This process takes place, typically, in a high-temperature vacuum environment.

Traditionally, application of such messages, advertising, or art has been attempted by selective mechanical removal of portions of the deposited film. See Japanese Patent 166,744 issued to S. Hoo, and German Patent 28,33,133, issued to Klaus Kall.

Conventional masking techniques are often unacceptable in the industrial environment. Adhesive backed-tapes and spray-on latex masks tend to emit a variety of gases when heated. These gases combine with the vaporized metals during the deposition process, creating opaque chemical compounds (for example, aluminum oxide) which contaminate the acrylic surface, leaving visible and undesirable blemishes, particularly where a transparent area is desired on the finished surface.

A much simplified and improved method for the manufacture of such mirrors is disclosed herein. Utilizing this method, a novel device is created which provides crisp definition of the message or art, insuring improved transparency of the non-mirrored areas of the surface of the acrylic.

It is a further object of the invention, therefore, to create a combined advertising and security medium which is aesthetically pleasing, commercially useful and economically beneficial by combining a surveillance and advertising device into a single component.

DESCRIPTION OF THE DRAWINGS

FIGS. 3a, 3b, 3c, 3d, 3e and 3f are stylized views depicting the method steps herein described.

DESCRIPTION OF THE PREFERRED EMBODIMENT

Figure 1:
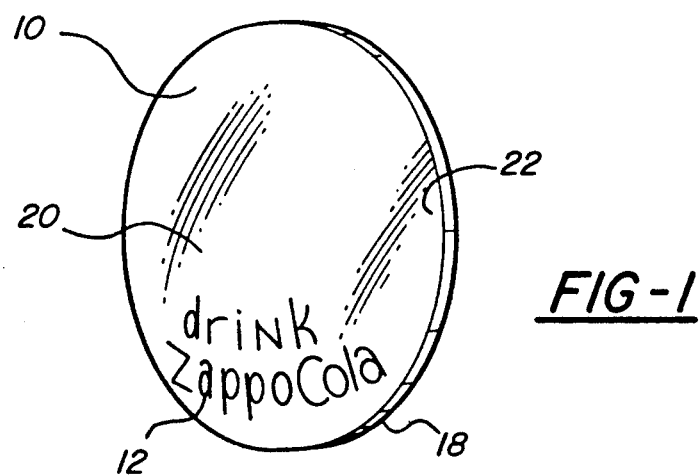
FIG. 1 is a perspective view of the invention.

In the preferred embodiment, as depicted in FIG. 1, a curved material 10 having a convex outer surface 20 and a concave inner surface 18, usually formed of transparent thermoplastic, is treated on its concave surface 18 with a mirroring material 22. This material 22 is preferably distributed on the concave surface 18 of the curved material 10 by depositing a vaporized metal in a near-vacuum environment. By selecting appropriate composition of the material 22 to be deposited, the color and optical properties of the resulting mirror may be altered. The shape of the curved material 10 is typically in the form of such a hollow sphere as intersected by a plane. The field of view available in said segment is determined by the arcuate dimension of the surface of the sphere utilized for the segment. Typically, a segment constituting 30 degrees of arc is utilized. However, it is possible to utilize as much as 180 degrees of arc (a hemisphere) for the mirrored segment. mirrored segment.

Figure 3:
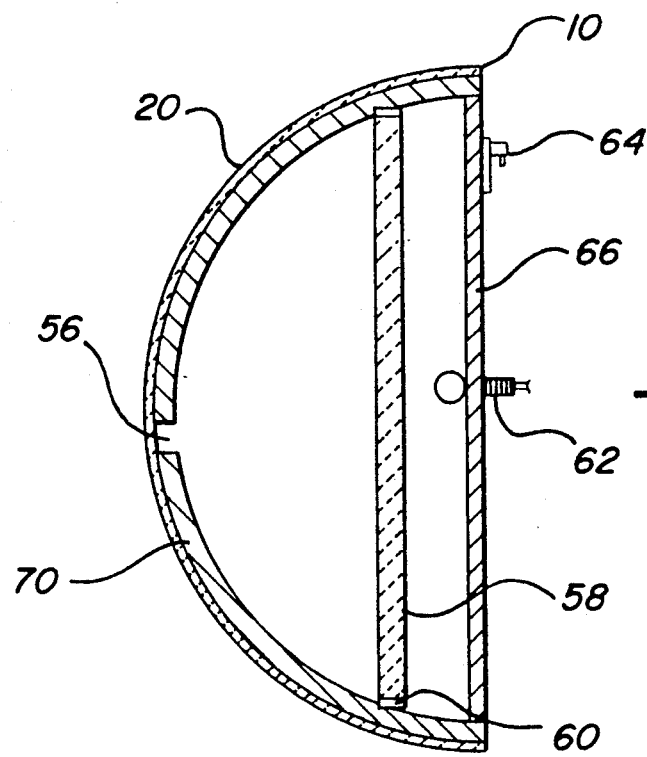
FIG. 3 is a cross-sectional view of the invention, showing the various components thereof.

To apply a desired advertisement, message, pattern or art work 12 to the mirror, the desired pattern to be imprinted is prepared in the form of a negative mask. In the preferred embodiment, the negative mask is applied by conventional silkscreening techniques. Referring now to FIGS. 3a–3c, a silkscreen so containing a mirror image of the desired pattern 52 is prepared using conventionally known silkscreening techniques. The completed silkscreen is then temporarily applied to the desired location on the interior, concave inner surface 18 of the transparent thermoplastic. The silkscreen may be temporarily secured using tape or other removable adhesive. Thereafter, a water-based resist material as herein described is applied to the silkscreen, and the silkscreen thereafter removed. Following removal of the silkscreen, a mirror image 53 of the desired pattern remains deposited on the concave inner surface 18 of the transparent thermoplastic 20. In a second embodiment, with reference to FIG. 3 and FIGS. 3d–3f, a flexible adhesive sheet 90 is applied to the desired location on the concave inner surface 18 of the curve material (FIG. 3b). The desired pattern 52 is then carefully cut into the sheet 90. The excess material 92 is allowed to remain temporarily on the surface, while the material 94 constituting the pattern is removed (FIG. 3c).

A water-based resist material consisting of approximately 11% by volume of polyvinyl alcohol, approximately 87% by volume of water, approximately 0.5% to 1% by volume isopropyl alcohol, 0.005% of any of a variety of commercially available surfactants, and 0.5 percent by volume of cornstarch is applied either through the silkscreen as above-described, or to the outline of the pattern left following removal of the pattern mask as described in the alternate embodiment (FIG. 3c). When necessary, a small percentage of antistatic material, such as guadanarianmean may be added to the water-base resist material to improve the antistatic properties of the resist material. The surfactants may be selected from any of a group of commercially available, widely used levelling agents, such as glycerine, polypropelene glycol or cylohexanol. The isopropyl alcohol portion of the resist material rapidly evaporates, leaving a flexible film principally composed of poly vinyl alcohol and cornstarch. This resist material has the desired property of exhibiting minimal outgassing during the vapor deposition process, while at the same time representing a benign agent to the acrylic material. A further desirable property of this material is its specific viscosity, which is ideally suited to silkscreen application. In the second embodiment, after application of the resist material, the remaining flexible mask 92 is removed, leaving on the concave inner surface of the curve material a mask 53 which precisely matches the desired pattern which will appear in the curved material after deposition of the vaporized metal. Further, the convex outer surface 20 of the curved material 10 is suitably masked or covered.

The curved material 10 so prepared is placed in a vacuum chamber, from which the air is evacuated until a level of $5 \times 10^{-4}$ or lower atmospheres is achieved. Thereafter, a source of vaporized metal material is introduced into the chamber. Typically, the metal is vaporized within the vacuum chamber by heating of a suitable compound which emits the desired metallic vapor under specified heat and pressure parameters. This material rapidly deposits in a thin film on all exposed surfaces within the chamber, including the concave inner surface 18 of the acrylic material and the resist.

Following the deposit of this material, the vacuum chamber is returned to atmospheric pressure, and the thermoplastic curved material 10 removed therefrom. The resist mask 53 is then peeled away from the inner surface of the curve material, leaving a transparent pattern 56 in the acrylic corresponding to the desired pattern, as depicted in FIG. 4.

In the preferred embodiment, as shown in FIG. 3, the design, pattern, message or art so formed by the mask is illuminated from the concave side of the curve material, said illumination being filtered through one or more transparent colored inserts 58 to render the desired visual effect. A colored flexible plastic insert 58 is secured to the concave inner surface 18 of the curved material by any suitable adhesive 60. A light source 62 is thereafter mounted on one side of the plastic insert as shown in FIG. 3. In the alternative, the curved material may be placed in an area, such as a store window, where it will be naturally back-lighted by outside illumination, such as sunlight. A backing plate 66 may be provided to support the completed assembly. The resulting effect is both pleasing to the eye and effective as an advertising media. Moreover, by elimination of the paper or latex masks traditionally used i this process, the transparent portion of the acrylic portion of the surface is free of discoloration and undesirable blemishes.

Figure 4:
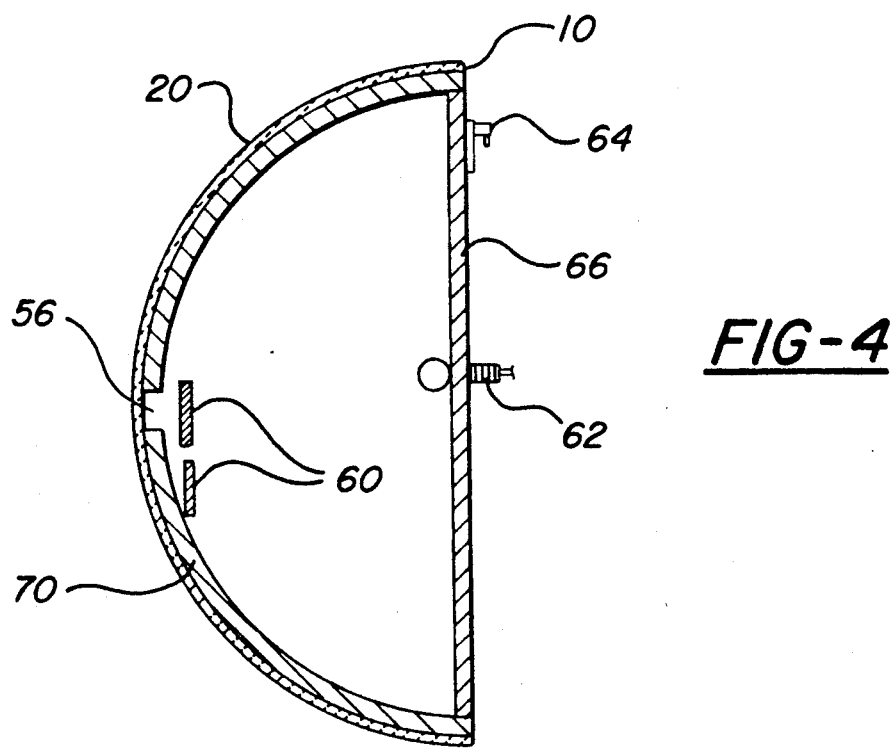
FIG. 4 is a cross-sectional view of the invention, in an alternate embodiment.

In an alternative embodiment of the invention, as shown in FIG. 4, different segments of the pattern 56 in the acrylic curved material 10 may be individually colored, by selective application f transparent paints or thin films of plastic 60 to selected portions of the transparent pattern 56 of the curved material following the deposition process. Further, the completed invention is typically provided with one or more mounting means 64 for securing the mirror in a desired position. These may take the form of molded-in protrusions, holes, or any of a variety of commonly used hardware, such as hooks.

Figure 2:
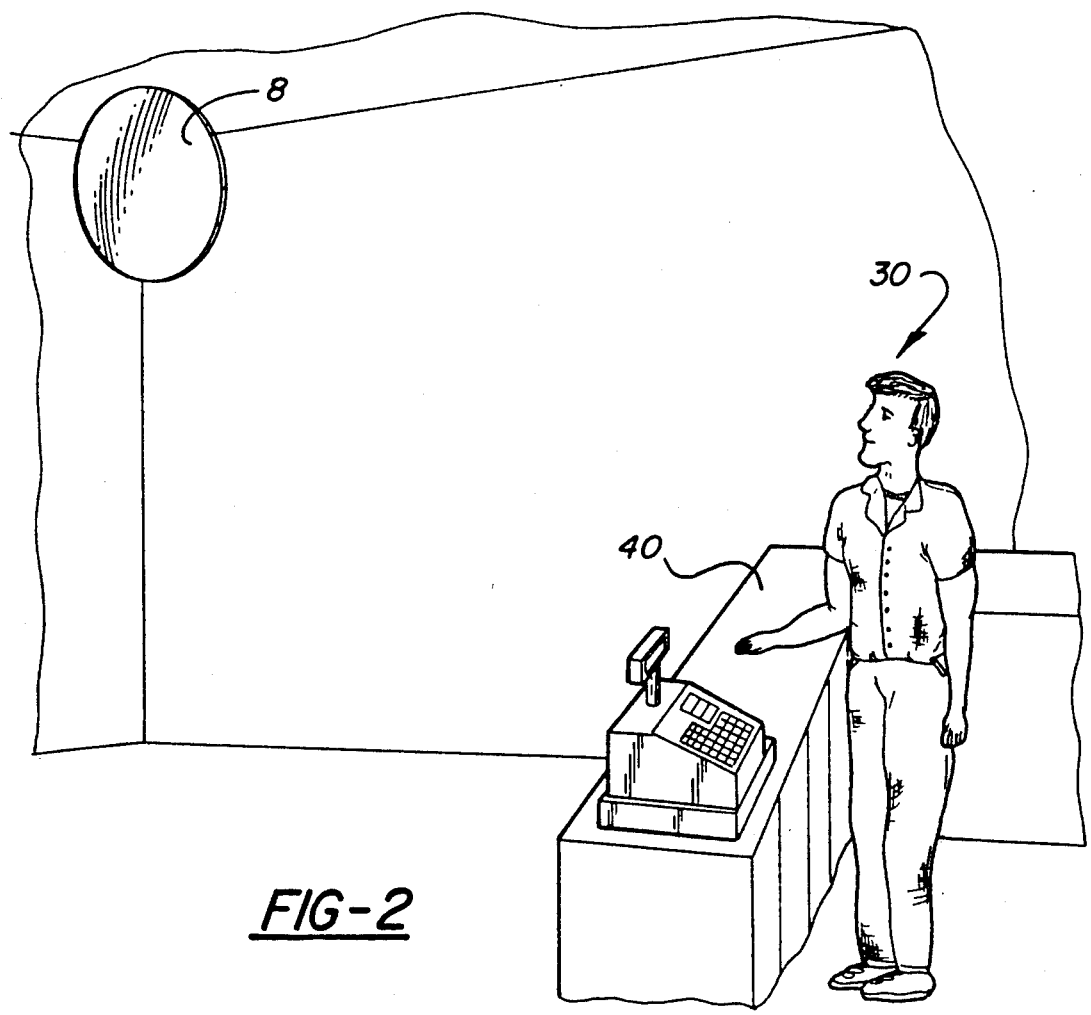
FIG. 2 is a stylized view of a commercial setting wherein the invention is used.

As is shown in FIG. 2, the preferred embodiment contemplates the mounting of the invention in a commercial setting, to permit the invention to serve both as a security mirror, and as an advertising device. In such an environment, for example, a clerk 30 can view activity in many areas of a commercial establishment via mirror 8, without leaving the vicinity of the clerk's station 40, which may be a counter, cash register or the like. Inasmuch as such security mirrors are typically placed in areas of commercial establishments which have high visibility from many points within the establishment, the invention is easily visible to customers, and thereby places the advertising message in a position seen by many. Further, the addition of the commercial message to the security device tends to minimize its apparent function as a surveillance device, thereby constituting a security measure which is unobtrusive and less offensive to the ordinary observer.

Having desired my invention, it will be apparent that many obvious improvements may be made thereto, without departing from the substance of my invention, which I claim as follows:

1. The method of creating a transparent area on an acrylic mirrored surface comprising the steps of:
   a. applying a removable mask with a desired pattern of openings therein to one surface of a two-sided transparent acrylic material;
   b. applying over said mask a water-based resist mixture comprising polyvinyl alcohol, water, isopropyl alcohol, a surfactant and cornstarch;
   c. allowing said resist mixture to dry;
   c. allowing said resist mixture to dry;
   d. removing said mask, leaving said resist;
   e. depositing a thin film of reflective material on said one surface, including said resist; and
   f. removing said resist.

2. The method of claim 1, wherein said removable mask further comprises a silkscreen.

3. The method of claim 1, wherein said step of applying a water-based resist mixture comprises the step of applying over said mask a water-based mixture comprising approximately 11% by volume of polyvinyl alcohol, approximately 0.5% to 1% by volume of isopropyl alcohol, approximately 0.005% by volume of a surfactant, approximately 0.5% by volume cornstarch, and the balance water.

4. The method of claim 1, wherein said step of applying a water-based resist mixture utilizes a surfactant selected from the group of surfactants consisting of glycerine, polypropelene glycol, and cyclohexanol.

5. The method of claim 1, wherein said step of applying a removable mask comprises the step of applying a removable mask with the desired pattern to the concave surface of a curved transparent acrylic material.

* * * * *

UNITED STATES PATENT AND TRADEMARK OFFICE
CERTIFICATE OF CORRECTION

PATENT NO. : 5,183,688
DATED : February 2, 1993
INVENTOR(S) : Sorko-Ram It is certified that error appears in the above-identified patent and that said Letters Patent is hereby corrected as shown below:

Column 2, line 35, delete "mirrored segment.";

Column 3, line 9, delete "cylohexanol" and insert --cyclohexanol--;

Column 3, line 61, delete "i this" and insert --in this--;

Column 4, line 2, delete "f transparent" and insert --of transparent--;

Column 4, line 29, delete "desired" and insert --described--;

Column 4, line 42, delete "c. allowing said resist mixture to dry;".

Signed and Sealed this

Thirtieth Day of November, 1993

Attest:

BRUCE LEHMAN

Attesting Officer

Commissioner of Patents and Trademarks